(12) United States Patent
Chen et al.

(10) Patent No.: US 8,049,323 B2
(45) Date of Patent: Nov. 1, 2011

(54) CHIP HOLDER WITH WAFER LEVEL REDISTRIBUTION LAYER

(75) Inventors: Chen-Shien Chen, Hsinchu (TW); Chao-Hsiang Yang, Hsinchu (TW); Jimmy Liang, Chung-Li (TW); Han-Liang Tseng, Hsinchu (TW); Mirng-Ji Lii, Sinpu Township, Hsinchu County (TW); Tjandra Winata Karta, Hsinchu (TW); Hua-Shu Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 589 days.

(21) Appl. No.: 11/675,984

(22) Filed: Feb. 16, 2007

(65) Prior Publication Data
US 2008/0197473 A1    Aug. 21, 2008

(51) Int. Cl.
*H01L 23/498* (2006.01)
*H01L 21/60* (2006.01)

(52) U.S. Cl. .......... 257/690; 257/780; 257/E23.009; 257/E23.02; 257/E23.021; 257/E21.511; 257/686; 257/685; 257/777; 257/723; 257/728; 257/773; 257/774

(58) Field of Classification Search .......... 257/686, 257/685, 777, 723, 728, 773, 774, 690, 780, 257/E23.009, E23.02, E23.021, E21.511; 438/125
See application file for complete search history.

(56) References Cited

U.S. PATENT DOCUMENTS

| | | | | |
|---|---|---|---|---|
| 4,451,845 A * | 5/1984 | Philofsky et al. | ............ | 257/703 |
| 4,639,760 A * | 1/1987 | Granberg et al. | ............ | 257/705 |
| 4,677,741 A * | 7/1987 | Takahama | ............ | 29/832 |
| 5,188,984 A * | 2/1993 | Nishiguchi | ............ | 438/107 |
| 5,652,466 A * | 7/1997 | Hirakawa et al. | ............ | 257/772 |
| 5,760,478 A * | 6/1998 | Bozso et al. | ............ | 257/777 |
| 6,115,255 A * | 9/2000 | Iovdalsky | ............ | 361/705 |
| 6,271,469 B1 * | 8/2001 | Ma et al. | ............ | 174/521 |
| 7,446,402 B2 * | 11/2008 | Hsu | ............ | 257/679 |
| 7,655,501 B2 * | 2/2010 | Yang et al. | ............ | 438/106 |
| 2003/0133274 A1 * | 7/2003 | Chen et al. | ............ | 361/760 |
| 2003/0156402 A1 * | 8/2003 | Ding et al. | ............ | 361/820 |
| 2005/0088190 A1 * | 4/2005 | Cheng et al. | ............ | 324/754 |
| 2006/0076686 A1 * | 4/2006 | Tuominen et al. | ............ | 257/773 |
| 2007/0158861 A1 * | 7/2007 | Huang et al. | ............ | 257/787 |
| 2008/0132006 A1 * | 6/2008 | Jiang et al. | ............ | 438/123 |
| 2008/0157316 A1 * | 7/2008 | Yang | ............ | 257/685 |
| 2008/0157396 A1 * | 7/2008 | Yang | ............ | 257/778 |
| 2008/0173792 A1 * | 7/2008 | Yang et al. | ............ | 250/208.1 |
| 2008/0182366 A1 * | 7/2008 | Ogawa et al. | ............ | 438/124 |
| 2008/0191297 A1 * | 8/2008 | Yang et al. | ............ | 257/432 |
| 2008/0197435 A1 * | 8/2008 | Yang et al. | ............ | 257/432 |
| 2008/0197469 A1 * | 8/2008 | Yang et al. | ............ | 257/686 |
| 2008/0217761 A1 * | 9/2008 | Yang et al. | ............ | 257/700 |

(Continued)

FOREIGN PATENT DOCUMENTS
JP    2005-209689    *  8/2005

*Primary Examiner* — A Williams
(74) *Attorney, Agent, or Firm* — Duane Morris LLP

(57) ABSTRACT

A chip holder formed of silicon, glass, other ceramics or other suitable materials includes a plurality of recesses for retaining semiconductor chips. The bond pads of the semiconductor chip are formed on or over an area of the chip holder that surrounds the semiconductor chip thus expanding the bonding area. The bond pads are coupled, using semiconductor wafer processing techniques, to internal bond pads formed directly on the semiconductor chip.

15 Claims, 4 Drawing Sheets

U.S. PATENT DOCUMENTS

| | | | |
|---|---|---|---|
| 2008/0224306 A1* | 9/2008 | Yang | 257/725 |
| 2008/0248614 A1* | 10/2008 | Yang et al. | 438/118 |
| 2008/0274579 A1* | 11/2008 | Yang et al. | 438/64 |
| 2009/0057903 A1* | 3/2009 | Okayama et al. | 257/741 |
| 2009/0079062 A1* | 3/2009 | Koide | 257/712 |
| 2009/0085436 A1* | 4/2009 | Kartashev et al. | 310/318 |
| 2009/0206464 A1* | 8/2009 | Chung et al. | 257/686 |
| 2010/0112735 A1* | 5/2010 | Lee et al. | 438/27 |

* cited by examiner

CHIP HOLDER WITH WAFER LEVEL REDISTRIBUTION LAYER

FIELD OF THE INVENTION

The present invention generally relates to semiconductor manufacturing and packaging, and more particularly to using a carrier substrate, i.e. chip holder to increase the pitch of bond pads for a semiconductor chip.

BACKGROUND

Increased miniaturization is an important goal in today's rapidly advancing semiconductor manufacturing industry. There is a push to reduce device feature sizes and to increase integration levels within a device as well as to reduce the size of the semiconductor chips themselves. CUP (circuit under pad) technologies have enabled the placement of bond pads anywhere on the semiconductor chip and also enabled additional bond pads to be packed in close proximity. While the increase in integration levels and advances in miniaturization provide semiconductor chips that can store more data, perform more functions and are smaller in size, an undesirable by-product of such a decrease in semiconductor chip size is that the bond pads for connecting the semiconductor chip to external features become smaller and more tightly packed. The ability to continue to shrink the size of the semiconductor chip is now limited by the constraints of the bonding processes used to package the semiconductor chips, i.e. to couple the bond pads to external components such as packaging elements, in both wire bond and flip chip processing. Both wire bonding and flip chip processing require a minimum bond pad size and a minimum spacing between the bond pads to bond a wire to or couple a solder ball to the bond pad.

There is therefore a tradeoff between reducing chip size to increase integration levels and providing bond pads that are large enough and spaced far apart enough to enable them to be coupled to external components using commercially available bonding processes used in assembling and packaging the semiconductor chips. The present invention addresses this shortcoming of conventional practices.

SUMMARY OF THE INVENTION

To address these and other needs and in view of its purposes, the present invention provides a semiconductor chip having a first area and including bond pads spread out over a second area being greater than the first area, and surrounding the semiconductor chip.

According to another aspect, the invention provides a carrier substrate, i.e., chip holder, being generally round and flat and formed of glass, silicon or a further ceramic and comprising a plurality of discrete modular units. Each modular unit includes a recess sized to receive a semiconductor chip therein and a peripheral portion surrounding the recess and including bond pads formed thereon. The bond pads are adapted to be interconnected to internal bond pads formed on the semiconductor chip and to be bonded to an external component.

According to another aspect, the invention provides a module of a semiconductor chip and a chip holder. The semiconductor chip is disposed within a recess formed in the chip holder. The semiconductor chip has a first area and the bond pads are spread out over a second area being greater than the first area. At least some of the bond pads include a solder ball formed thereover.

According to yet another aspect, a method for assembling a semiconductor chip is provided. The method includes providing a carrier substrate with a recess in a surface thereof, placing and bonding the semiconductor chip in the recess, the semiconductor chip having a plurality of internal bond pads disposed on a surface thereof. The method further includes forming a plurality of bond pads over the carrier substrate in an area of the carrier substrate that surrounds the semiconductor chip and coupling the internal bond pads to the bond pads.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The present invention provides a method and structure for expanding the size and pitch of bond pads and increasing the bonding area upon which the bond pads are formed on a semiconductor chip, by providing a chip holder that retains the semiconductor chip and provides an expanded area that includes the bond pads coupled to the semiconductor chip by providing bond pads on or over the surface of the chip holder that retains the semiconductor chip. The semiconductor chip may then be packaged in the chip holder, which may alternatively be referred to as a carrier substrate.

The invention provides for inserting at least one semiconductor chip into a corresponding recess formed within the chip holder using automated die pick and placement equipment then processing the chip holder including one or more semiconductor chips using commercially available manufacturing and fabrication equipment used to fabricate the semiconductor chips themselves. The chip holders are sized and formed of materials compatible with processing in automated semiconductor fabrication equipment. The chip holders may include a plurality of recesses, each for receiving a semiconductor chip therein.

Figure 1:
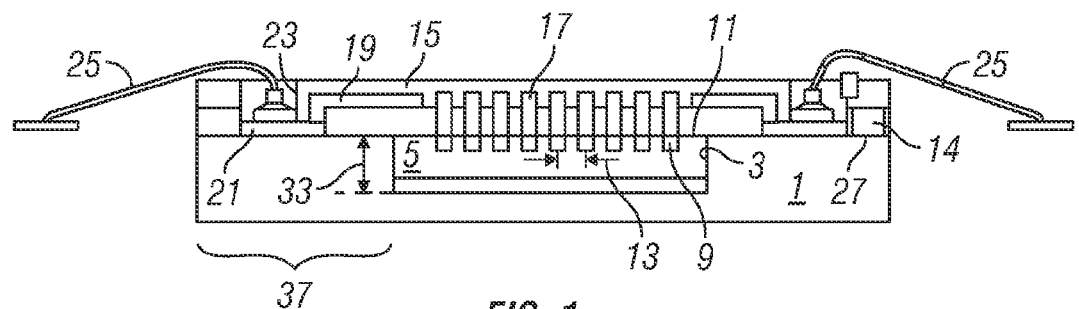
FIG. 1 is a cross-sectional view showing a semiconductor chip within an exemplary chip holder.
Figure 2:
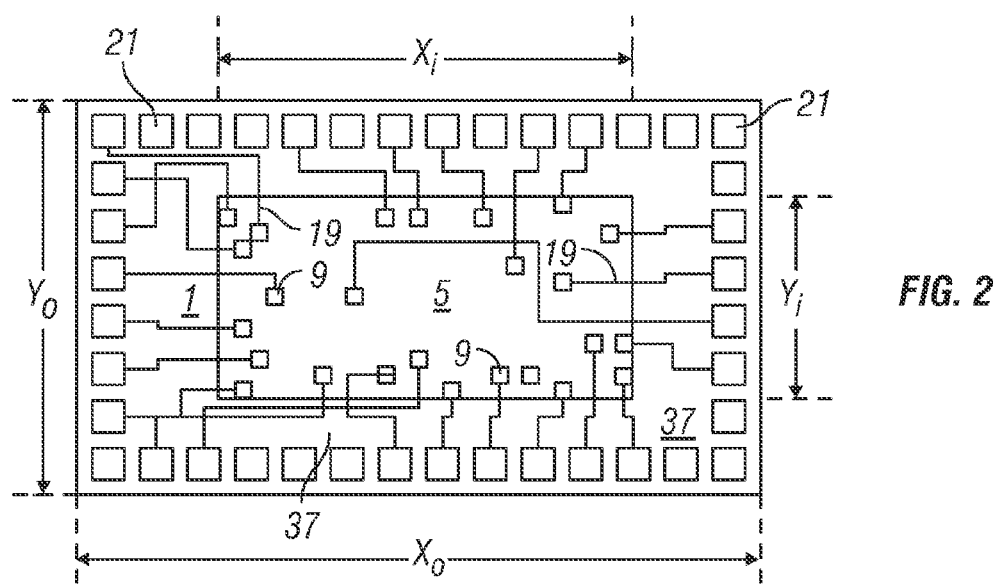
FIG. 2 is a plan view of an exemplary semiconductor chip in an exemplary chip holder.

FIG. 1 is a cross-sectional view illustrating semiconductor chip 5 disposed within recess 3 of chip holder 1. Adhesive 7 secures semiconductor chip 5 within recess 3. Semiconductor chip 5 may be of various dimensions and may represent various semiconductor devices. Semiconductor chip 5 includes internal bond pads 9 formed on surface 11 and internal bond pads 9 include pitch 13. Chip holder 1 may be formed of various suitable materials including but not limited to silicon, glass and other suitable ceramic materials. Depth 33 of recess 3 is chosen in conjunction with semiconductor chip 5 to enable top surface 11 of semiconductor chip 5 to be essentially coplanar with surface 27 of chip holder 1 in an advantageous embodiment. Dielectric layers 14 and 15 are formed over surface 11 of semiconductor chip 5 and surface 27 of chip holder 1. Various materials may be used for dielectric layers 14 and 15 and in other exemplary embodiments there may be additional dielectric layers or only one dielectric layer. The unit consisting of semiconductor chip 5 retained within chip holder 1 is adapted for packaging as a unit. Openings 23 are formed through dielectric layers 14 and 15 and expose bond pads 21 formed on surface 27 of chip holder 1. Bond pads 21 are coupled via wire 25 to an external component in the illustrated embodiment but other bonding features such as solder balls may be used in other exemplary embodiments FIG. 2 is a top, plan view showing semiconductor chip 5 disposed within recess 3 formed in chip holder 1. Bond pads 21 include pitch 35 which is greater than pitch 13 of internal bond pads 9 shown in FIG. 1. Pitch 25 may be at least two times as great as pitch 13 in one exemplary embodiment. Bond pads 21 also include a contact area greater in size than the contact area for internal bond pads 9. Bond pads 21 are formed on or over surrounding area 37 of chip holder 1 and may be formed of conventional materials and using conventional methods. Bond pads 21 are therefore spread out over an area being the product of $x_o y_o$, such area being greater than the area defined by $x_i y_i$. The increased area may represent an area increase of 10% to 1000%. In one exemplary embodiment, area $x_o y_o$ may be at least two times area $x_i y_i$. As such, the footprint of semiconductor chip is expanded and the bond pads for bonding to external electrical components to semiconductor chip 5 are now spread out over a bonding area $(x_o y_o)$ greater than the original area $(x_i y_i)$ of semiconductor chip 5. Bond pads 21 of semiconductor chip 5 are therefore formed in a region peripherally surrounding semiconductor chip 5.

Figure 3:
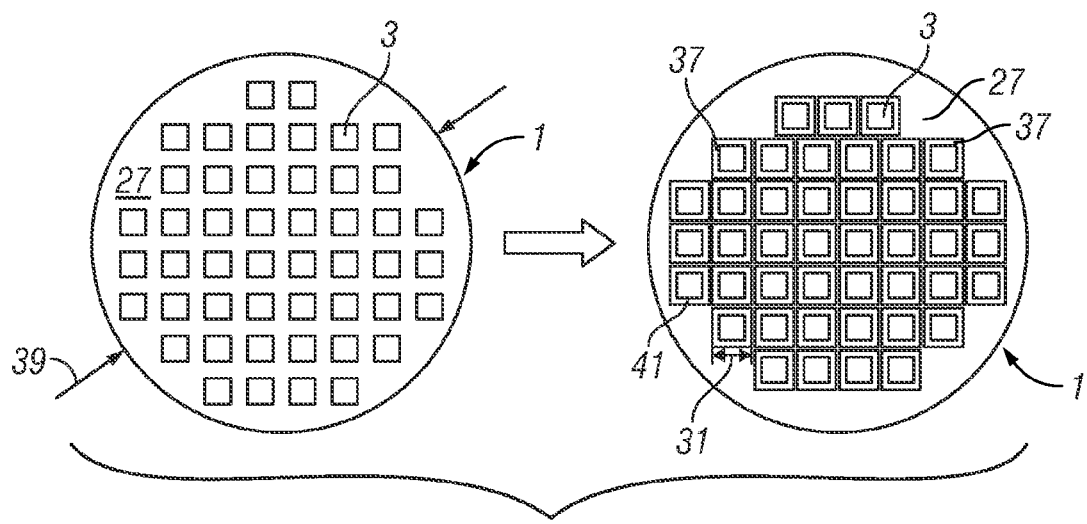
FIG. 3 includes two plan views of an exemplary chip holder.

FIG. 3 is a plan view showing an exemplary chip holder 1 with a plurality of recesses 3 formed in surface 27 thereof. Recesses 3 are formed in a regular pattern in the illustrated embodiment but other arrangements may be used in other exemplary embodiments. Each recess 3 will receive a corresponding semiconductor chip therein and once received in the corresponding recesses 3, the semiconductor chips 5 are generally disposed further from one another than the width of a scribe line, the distance that semiconductor chips 5 are spaced from one another during processing in wafer form. Diameter 39 of chip holder 1 may be 6 inches, 8 inches, 10 inches, 12 inches, or other suitable diameters such as used for semiconductor wafers. The thickness of chip holder 1 is chosen to be commensurate with the thickness of a semiconductor wafer of the same diameter. This enables chip holder 1 to be handled and processed in conventional automated semiconductor equipment used to process and transport semiconductor wafers upon which the semiconductor chips are being formed. FIG. 3 also shows an illustration of chip holder 1 divided into a plurality of modules 41. Each module 41 includes recess 3 and surrounding portion 37. After a series of process operations in which chip holder 1 is processed retaining semiconductor chips 5 through semiconductor fabrication equipment used to process product wafers, the modules are diced or otherwise separated and the individual modular unit of semiconductor chip 5 retained within a portion of chip holder 1, is then packaged as a unit such as the unit illustrated in FIG. 1. The packaging may include flip chip assembly, wire bonding or other assembly techniques.

Figure 4A:
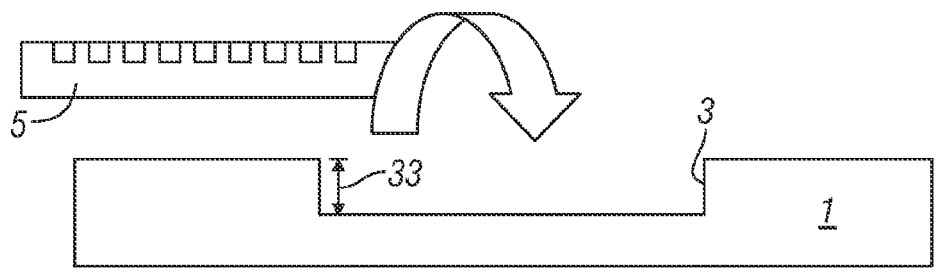
FIGS. 4A-4G are cross-sectional views illustrating a sequence of process operations according to the invention.

FIG. 4A is a cross-sectional view showing semiconductor chip 5 and previously described chip holder 1. Recess 3 may be formed using various conventional processes such as patterning and etching. Depth 33 is chosen in conjunction with the dimensions of semiconductor chip 5 as discussed, infra. In one exemplary embodiment, depth 33 may be 12 mils, but other depths may be used in other exemplary embodiments and determined in conjunction with the dimensions of semiconductor chip 5. Conventional die pick and place equipment may be used to align semiconductor chip 5 with recess 3 and to place and bond semiconductor chip 5 within recess 3.

Figure 4B:
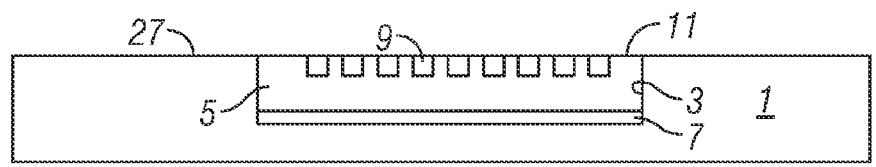

FIG. 4B shows semiconductor chip 5 disposed within recess 3 and bonded to chip holder 1 using adhesive 7. Various conventional adhesives may be used. Surface 11 of semiconductor chip 5 and surface 27 of chip holder 1 are substantially coplanar. Internal bond pads 9 may be formed about the periphery of semiconductor chip 5 or they may be formed at any other location on semiconductor chip 5 and CUP technology may advantageously be used.

Figure 4C:
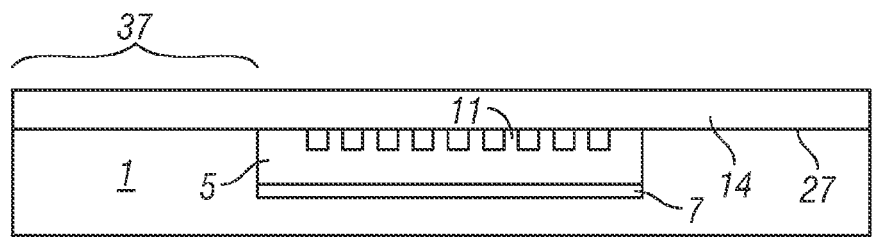

FIG. 4C shows dielectric layer 14 formed over semiconductor 5 and chip holder 1. In various exemplary embodiments, bond pads such as bond pads 21 shown in FIG. 1 may have been pre-formed on surface 27 of chip holder 1 in surrounding portion 37. In one exemplary embodiment, dielectric layer 14 may be a high-viscosity, spin-on glass, but other dielectrics may be used in other exemplary embodiments. The spin-on glass or other suitable dielectric may be formed over chip holder 1 shown in FIG. 3 and including a plurality of semiconductor chips 5 formed within the recesses 3, using conventional semiconductor manufacturing equipment. Chip holder 1 including a plurality of semiconductor chips 5 is processed to provide wafer level redistribution layers or post-passivation interconnect processes.

Figure 4D:
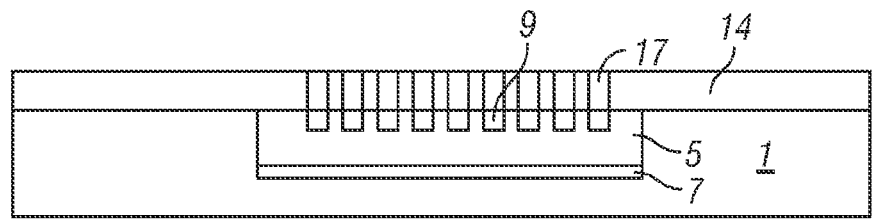
Figure 4E:
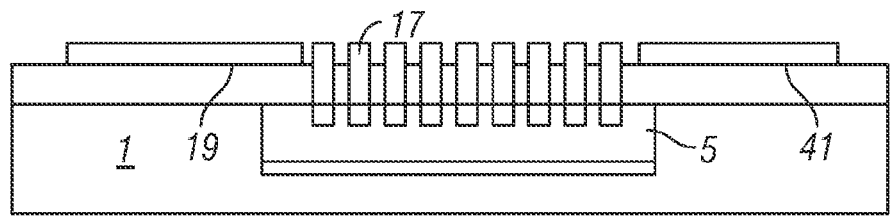

Vias 17 are then formed in dielectric layer 14 as shown in FIG. 4D. Conventional post-passivation interconnect processing methods may be used. Vias 17 expose internal bond pads 9. FIG. 4E shows metal 41 formed in vias 17 and also forming interconnect leads 19. Metal 41 may be copper or other suitable materials such as aluminum, and dry film processing and patterning techniques may be used to pattern metal 41 into the aforementioned structures. Vias 17 and conductive leads 19 represent post-passivation interconnect, PPI, structures.

Figure 4F:
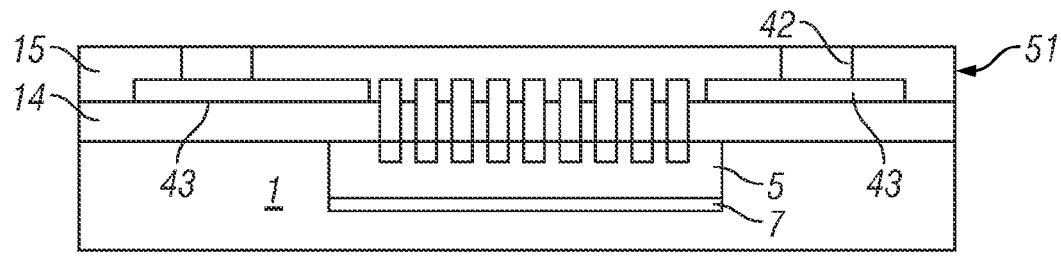

Dielectric layer 15 is formed over the structure of FIG. 4E to produce the structure illustrated in FIG. 4F. Various suitable passivation materials may be used for passivation layer 15 and, again, chip holder 1 is processed as a unit including a plurality of semiconductor die 5 and using conventional and automated semiconductor manufacturing equipment. Openings 42 are formed through dielectric layer 15 to expose bond pads 43. According to other exemplary embodiments in which the bond pads are pre-formed on surface 27 of chip holder 1, the openings will be formed to extend through both dielectric layer 15 and dielectric layer 14. For example, FIG. 1 shows opening 23 extending through dielectric layers 14 and 15 to expose bond pad 21 disposed directly on surface 27. After a plurality of the structures shown in FIG. 4F are simultaneously formed on chip holder 1, the modules (41 of FIG. 3) of chip holder 1 may be separated using conventional dicing techniques such as sawing or other separation techniques. The individual module units 51 including semiconductor chip 5 within surrounding portion 37 of chip holder 1, may then be packaged/assembled using various different techniques for joining conductive materials to the bond pads.

Figure 4G:
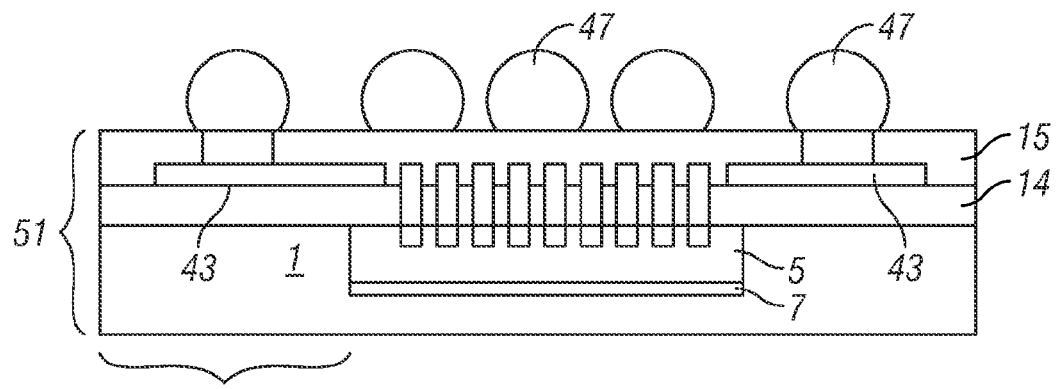

Continuing in the process sequence illustrated in FIGS. 4A-4G, a conductive material such as a wire bond or solder ball may be bonded to bond pad 43 through opening 23. FIG. 4G shows solder balls 47 formed over the structure shown in FIG. 4F and coupled to bond pads 43 through opening 23, now filled with solder. Solder balls 47 may be formed using conventional ball grid array, BGA, ball mounting techniques as used in flip chip packaging. In other exemplary embodiments, plating techniques and/or wire bonding techniques may be used to package the modular unit 51 consisting of semiconductor chip 5 and surrounding portion 37 of chip holder 1. The spacing between adjacent bond pads 43 and the size of bond pads 43 is sufficient to accommodate the formation of solder balls 47 using conventional formation methods.

Figure 5:
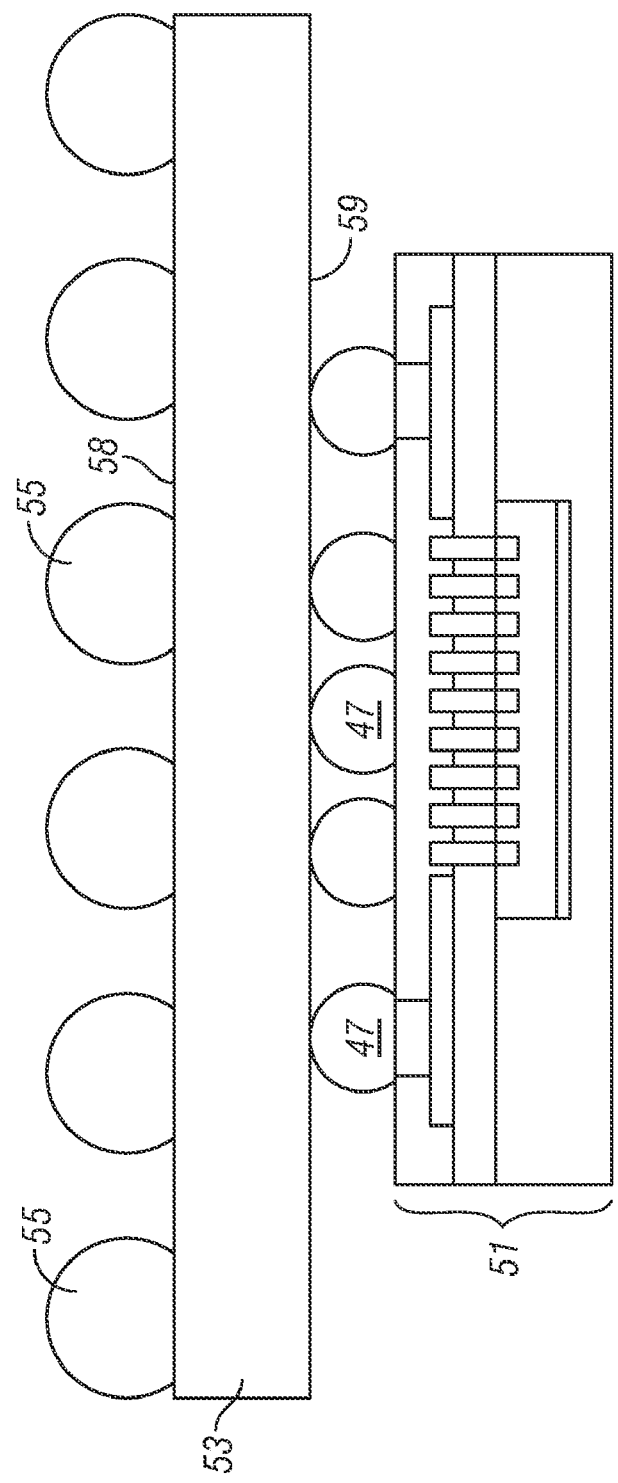
FIG. 5 is a cross-sectional view of a semiconductor chip in an exemplary chip holder and including solder balls formed thereon.

FIG. 5 shows modular unit 51 including solder balls 47 coupled to a first surface 59 of substrate 53 that includes solder balls 55 on an opposed surface 58 thereof. Substrate 53 may be a package substrate and modular unit 51 may be flip chip bonded to substrate 53 or to other components but other mounting and packaging techniques may be used in other exemplary embodiments. Modular unit 51 includes semiconductor chip 5 and a portion of chip holder 1. In this manner, the footprint of the semiconductor chip is further expanded as solder balls 55 are larger than, and spaced further apart, i.e., have a greater pitch than, solder balls 47. Assembly and packaging is thereby made easier using some conventional packaging and assembly equipment.

The semiconductor chip 5 chip holder 1 arrangement is not intended to be limited to the exemplary arrangements shown and various different post-passivation interconnect or redistribution layer processes may be used to form bond pads on or over the chip holder in areas surrounding the semiconductor chip, for connecting these bond pads to the internal bond pads of the semiconductor chip and for packaging the chip holder/semiconductor chip unit. For wire bond applications, typical sawing processes may be used to separate the modules shown in FIG. 3, then conventional wire bonding and molding processes used to package the unit using wire bonding methods. For flip chip applications, printed BGA ball or silver paste processes may be used for conventional and COB, chip on board processes, for example.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the structure be constructed or operated in a particular orientation. Terms concerning attachments, coupling and the like, such as "connected" and "interconnected," refer to a relationship wherein components are secured or attached to one another either directly or indirectly through intervening components, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A module comprising a semiconductor chip having a first area and bond pads spread out over a second area being greater than said first area, said bond pads each directly coupled to a corresponding wire that is joined to a further component, wherein said semiconductor chip is retained within a recess formed in a chip holder, said bond pads are disposed directly on and contacting a chip holder surface, said semiconductor chip includes internal bond pads disposed on said top surface and each directly coupled to a corresponding one of said bond pads, and said top surface of said semiconductor chip and said chip holder surface are substantially coplanar.

2. The module as in claim 1, wherein said bond pads include a size being at least two times a size of internal bond pads formed directly on said semiconductor chip and said bond pads include a pitch being at least two times as great as a pitch of said internal bond pads.

3. The module as in claim 1, wherein said bond pads are disposed within a portion of said second area that surrounds said first area.

4. The module as in claim 1, wherein said bond pads are formed on said chip holder in a region that surrounds said semiconductor chip.

5. The module as in claim 4, wherein said semiconductor chip and said holder are disposed within a package and said further component is disposed within said package.

6. The module as in claim 1, wherein said chip holder is formed of glass, silicon or a ceramic.

7. The module as in claim 1, wherein said internal bond pads are coupled to said bond pads via interconnect leads formed in at least one passivation layer formed over said semiconductor chip and said chip holder.

8. A module comprising a semiconductor chip and a chip holder, said semiconductor chip disposed within a recess formed in said chip holder, having a first area and bond pads spread out over a second area being greater than said first area, at least some of said bond pads directly coupled to a corresponding wire that is joined to a further component, wherein said bond pads include outer bond pads disposed directly on and contacting a chip holder surface and internal bond pads disposed directly on and contacting a top surface of said semiconductor chip and each directly coupled to a corresponding one of said outer bond pads, said chip holder surface and said top surface being substantially coplanar.

9. The module as in claim 8, wherein at least some of said outer bond pads are disposed on said chip holder in a region that surrounds said semiconductor chip.

10. The module as in claim 9, wherein said outer bond pads include a first pitch being greater than a second pitch of said internal bond pads.

11. A method for assembling a semiconductor chip, said method comprising:

providing a carrier substrate with a recess in a top surface thereof;

placing and bonding said semiconductor chip in said recess, said semiconductor chip having a plurality of internal bond pads disposed on a chip surface thereof, said chip surface and said top surface being substantially coplanar;

forming a plurality of bond pads directly on and contacting said top surface of said carrier substrate in an area of said carrier substrate surrounding said semiconductor chip;

interconnecting each of said internal bond pads to a corresponding one of said bond pads; and directly coupling at least one of said bond pads to a wire that is coupled to at least one external component.

12. The method as in claim 11, wherein said interconnecting comprises forming at least one dielectric layer over said semiconductor chip and over said carrier substrate and forming conductive leads in or over at least one dielectric layer of said at least one dielectric layer.

13. The method as in claim 12, wherein said carrier substrate includes a diameter being one of six inches, eight inches, ten inches and twelve inches, further comprising a plurality of said recesses in said surface and a plurality of said semiconductor chips disposed in said plurality of recesses, and wherein said forming at least one dielectric layer and said forming conductive leads takes place in conventional semiconductor equipment used for processing wafers upon which said semiconductor chips are formed.

14. The method as in claim 12, wherein said forming at least one dielectric layer comprises forming a spin on glass layer over said semiconductor chip and said carrier substrate and forming a passivation layer over said spin on glass, and wherein said coupling comprises forming vias in said spin on glass to expose said internal bond pads and forming conductive leads coupling said bond pads to said internal bond pads via said vias.

15. The method as in claim 11, wherein said bond pads each have a first size, and said internal bond pads each have a second size, said first size being greater than said second size, and wherein said bond pads have a pitch at least two times greater than a pitch between said internal bond pads.

* * * * *